United States Patent
Koo

(10) Patent No.: US 7,447,017 B2
(45) Date of Patent: Nov. 4, 2008

(54) COMPUTER HAVING A HEAT DISCHARGING UNIT

(76) Inventor: Kyung-ha Koo, Hankook Apt., #101-702, 65-12, Yeokchon-2dong, Eunpyeong-gu, Seoul (KR)

( * ) Notice: Subject to any disclaimer, the term of this patent is extended or adjusted under 35 U.S.C. 154(b) by 119 days.

(21) Appl. No.: 11/440,269

(22) Filed: May 25, 2006

(65) Prior Publication Data

US 2006/0279926 A1 Dec. 14, 2006

(30) Foreign Application Priority Data

Jun. 11, 2005 (KR) .................. 10-2005-0050151

(51) Int. Cl.
*H05K 7/20* (2006.01)
*H01L 23/36* (2006.01)

(52) U.S. Cl. .......... 361/688; 361/687; 361/690; 361/697; 361/700; 361/714; 165/80.3; 165/80.4; 165/104.21; 165/104.33; 174/50

(58) Field of Classification Search ........ 365/687, 365/690, 692, 695–697, 699–702, 714–719, 365/721, 736, 752; 174/15.1, 15.2, 16.3, 174/50; 165/80.3, 80.4, 80.5, 104.21, 104.22, 165/104.26, 104.28, 104.33, 104.34; 257/714–718, 257/722, 727, 675–678
See application file for complete search history.

(56) References Cited

U.S. PATENT DOCUMENTS

| | | | |
|---|---|---|---|
| 5,959,837 A | | 9/1999 | Yu |
| 6,088,223 A | * | 7/2000 | Diemunsch .............. 361/690 |
| 6,209,631 B1 | * | 4/2001 | Garcia-Ortiz ............ 165/287 |
| 6,549,414 B1 | * | 4/2003 | Tokuhara et al. ......... 361/719 |
| 6,798,661 B1 | * | 9/2004 | Barsun et al. ........... 361/700 |
| 6,900,984 B2 | * | 5/2005 | Merz et al. ............. 361/687 |
| 7,130,193 B2 | * | 10/2006 | Hirafuji et al. .......... 361/700 |
| 7,133,284 B2 | * | 11/2006 | Lee ...................... 361/697 |

(Continued)

FOREIGN PATENT DOCUMENTS

EP 0 767 415 B1 4/1997

(Continued)

OTHER PUBLICATIONS

KR Office Action dated Aug. 31, 2006 issued in KR 2005-50151.

*Primary Examiner*—Michael V Datskovskiy
(74) *Attorney, Agent, or Firm*—Stanzione & Kim, LLP

(57) ABSTRACT

A computer has a casing that accommodates a main board having a heat generating component that generates heat therein. The computer includes an internal heat discharging part disposed in the casing and coupled with the main board to discharge a first portion of the heat generated by the heat generating component, an external heat discharging part provided on an external surface of the casing to discharge a second portion of the heat generated by the heat generating component, and a heat transmission part to transmit the first and second portions of the heat generated by the heat generating component to the internal and the external heat discharging parts, respectively, such that the first and second portions of the heat generated from the heat generating component is discharged through the internal and the external heat discharging parts, respectively. Accordingly, the computer has a simple structure and assembly and an improved heat discharging efficiency.

22 Claims, 5 Drawing Sheets

U.S. PATENT DOCUMENTS

| | | | |
|---|---|---|---|
| 7,145,775 B2 * | 12/2006 | Barsun et al. | 361/719 |
| 7,177,154 B2 * | 2/2007 | Lee | 361/704 |
| 7,277,282 B2 * | 10/2007 | Tate | 361/697 |
| 7,277,286 B2 * | 10/2007 | Lee | 361/700 |
| 2004/0047126 A1 | 3/2004 | Shih-Tsung | |
| 2004/0184236 A1 | 9/2004 | Lee | |
| 2005/0030719 A1 * | 2/2005 | Lin et al. | 361/719 |
| 2005/0286229 A1 * | 12/2005 | Ku | 361/709 |

FOREIGN PATENT DOCUMENTS

| | | |
|---|---|---|
| JP | 409162580 A * | 6/1997 |
| JP | 3412604 | 3/2003 |
| KR | 1998-020201 | 7/1998 |
| KR | 10-0216482 | 5/1999 |
| KR | 10-0330161 | 3/2002 |
| KR | 2004-97888 | 11/2004 |

* cited by examiner

COMPUTER HAVING A HEAT DISCHARGING UNIT

CROSS-REFERENCE TO RELATED APPLICATIONS

This application claims the benefit of Korean Patent Application No. 2005-50151, filed on Jun. 11, 2005 in the Korean Intellectual Property Office, the disclosure of which is incorporated herein by reference in its entirety.

BACKGROUND OF THE INVENTION

1. Field of the Invention

The present general inventive concept relates to a computer, and more particularly, to a computer having a simple structure and assembly that discharges heat efficiently.

2. Description of the Related Art

Generally, when a power button of a computer main body is selected to turn a computer on, the computer begins to operate as power is supplied by a power supply device to components inside the computer main body. At this time, heat is generated from a hard disk, a variety of controllers and drives, including a central processing unit mounted on a main board and a variety of other electronic components as well as the power supply device itself.

The heat generated inside the computer main body may cause a computer system to malfunction and may shorten life spans of the components inside the computer main body and/or the computer itself. Thus, it is important to efficiently discharge the heat in order for the computer to operate at its optimal performance level.

U.S. Patent Application Publication 2004/47126 describes a conventional cooling device capable of cooling a central processing unit (CPU) that generates heat. The conventional cooling device has a cooling fin provided at an upper side of the CPU, a heat sink installed on a part of an inside wall of a computer casing, a heat pipe to interconnect the cooling fin and the heat sink, and a cooling fan disposed in front of the heat sink. According to this configuration, the heat generated from the CPU is discharged through the cooling fin and the heat sink.

However, this conventional cooling device may require a heat discharging fin and the heat sink to have a large size, or may require a large-sized cooling fan to be mounted in order to improve an efficiency of discharging the heat.

The large-sized heat discharging fin and heat sink occupy an increased amount of an inner space of the computer casing, thereby reducing an available amount of the inner space of the computer casing. In addition, when the large-sized cooling fan is mounted, noise from operation of the cooling fan is increased.

SUMMARY OF THE INVENTION

The present general inventive concept provides a computer having a simple structure and assembly and an improved heat discharging efficiency.

Additional aspects and/or utilities of the present general inventive concept will be set forth in part in the description which follows and, in part, will be obvious from the description, or may be learned by practice of the general inventive concept.

The foregoing and/or other aspects and utilities of the present general inventive concept may also be achieved by providing a computer comprising a main board having a heat generating component that generates heat disposed thereon, a casing to accommodate the main board therein, an internal heat discharging part disposed in the casing and coupled with the main board to discharge a first portion of the heat that is generated by the heat generating component, an external heat discharging part provided on an external surface of the casing to discharge a second portion of the heat that is generated by the heat generating component, and a heat transmission part to transmit the first and second portions of the heat generated by the heat generating component to the internal and the external heat discharging parts, respectively, such that the first and second portions of the heat generated by the heat generating component are discharged through the internal and the external heat discharging parts, respectively.

The heat transmission part may comprise a heat transmission pipe having a first side that contacts the heat generating component and a second side that contacts the external heat discharging part by way of the internal heat discharging part.

The heat transmission part may further comprise a heat transmission plate coupled with the second side of the heat transmission pipe to contact an internal surface of the casing to transmit the second portion of the heat to the external heat discharging part.

The internal heat discharging part may comprise a base part coupled with the main board so as to contact the heat generating component, and a plurality of heat discharging fins provided on top of the base part.

The heat transmission pipe may comprise a main body extending through the heat discharging fins to contact the base part, and a bent part that is bent with respect to the main body along a direction that is transverse to the main body coupled with the heat transmission plate.

The heat transmission part may further comprise an auxiliary heat transmission plate interposed between the internal heat discharging part and an internal surface of the casing to transmit the second portion of the heat to the external heat discharging part.

The computer may further comprise one or more coupling parts to couple the heat transmission pipe and the auxiliary heat transmission plate respectively to the casing.

The external heat discharging part may comprise a heat sink coupled with an external surface of the casing.

The foregoing and/or other aspects and utilities of the present general inventive concept may also be achieved by providing a computer, including a casing including a heat sink portion, a heat generating component disposed in the casing that generates heat during operation, and a heat discharging fin unit disposed on the heat generating component and being connected to the heat sink portion of the casing via one or more heat transmission plates.

The foregoing and/or other aspects and utilities of the present general inventive concept may also be achieved by providing a computer, including a casing having a heat sink portion, an internal heat discharging element disposed in the casing to internally discharge heat from components in the casing, and one or more heat conductive plates to connect the internal heat discharging element with the heat sink portion of the casing.

The foregoing and/or other aspects and utilities of the present general inventive concept may also be achieved by providing a heat discharging device usable with a computer having a casing with a heat sink portion, the device including a heat discharging fin unit disposed on a heat generating component disposed in the casing, and one or more heat transmission plates to connect the heat discharging fin unit to the heat sink portion on the casing.

The foregoing and/or other aspects and utilities of the present general inventive concept may also be achieved by providing a computer including a first casing having a space within which a mainboard and a heat generating element are disposed, a second casing coupled to the first casing, and having heat discharging fins, and a heat discharging unit disposed to directly contact the heat generating element and the heat discharging fins to directly transmit heat from the heat generating element to an outside of the second casing.

BRIEF DESCRIPTION OF THE DRAWINGS

The above and/or other aspects and utilities of the present general inventive concept will become apparent and more readily appreciated from the following description of the embodiments, taken in conjunction with the accompany drawings of which.

DETAILED DESCRIPTION OF THE PREFERRED EMBODIMENTS

Figure 1:
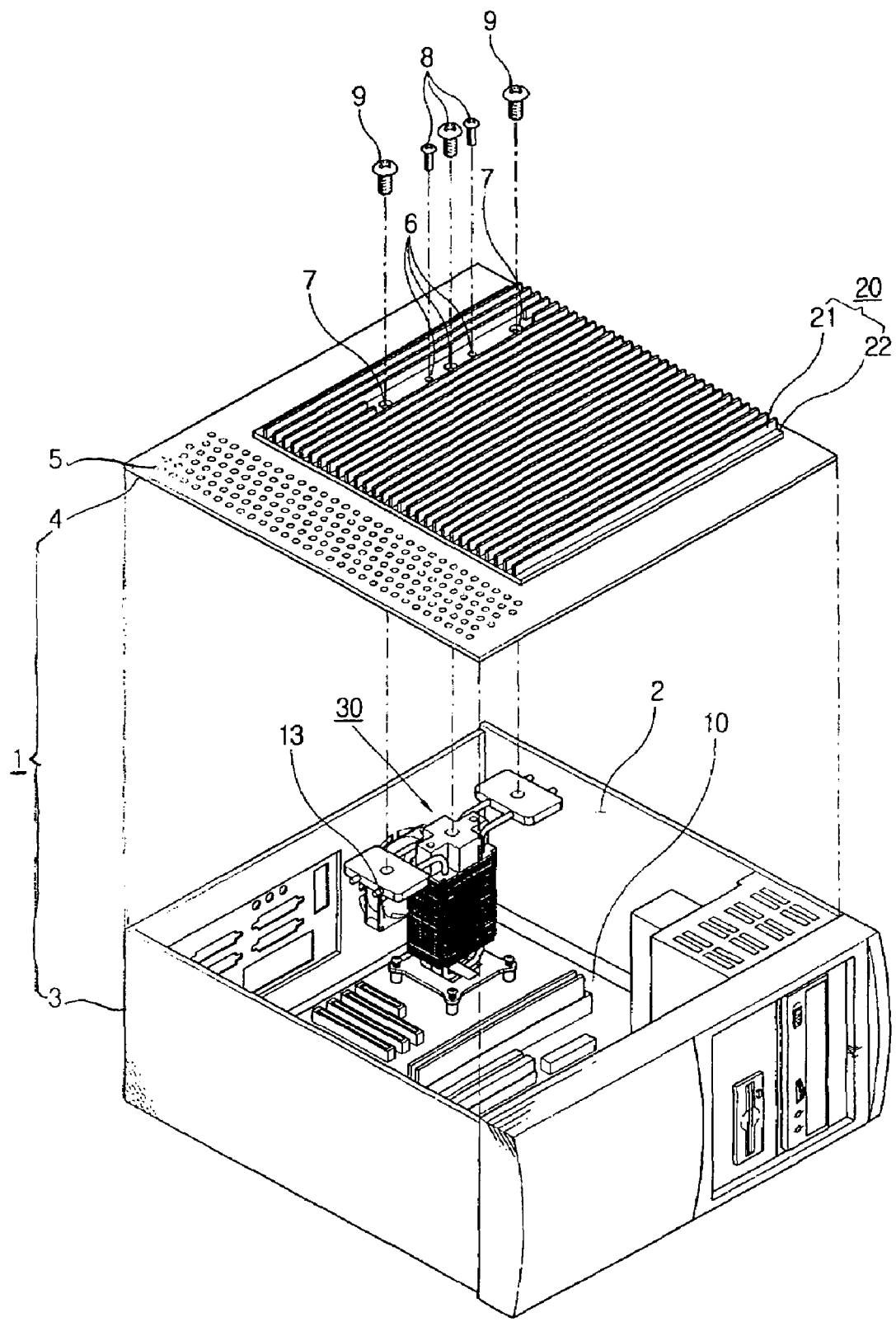
FIG. 1 is an exploded perspective view illustrating a computer including a computer casing having a main casing and a cover casing, according to an embodiment of the present general inventive concept.

Reference will now be made in detail to the embodiments of the present general inventive concept, examples of which are illustrated in the accompanying drawings, wherein like reference numerals refer to like elements throughout. The embodiments are described below in order to explain the present invention by referring to the figures.

FIG. 1 is an exploded perspective view illustrating a computer having a computer casing 1 including a main casing 3 and a cover casing 4 according to an embodiment of the present general inventive concept. As illustrated in FIG. 1, the computer casing 1 includes the main casing 3 formed with an opening 2 to receive a plurality of hardware units and/or components to be accommodated in the computer casing 1 and the cover casing 4 detachably mounted on the main casing 3 to open and close the opening 2.

A heat discharging unit 30 is provided inside the main casing 3, and a cooling fan 13 is provided in front of the heat discharging unit 30 between the main casing 3 and the heat discharging unit 30. The heat discharging unit 30 is an internal heat discharging unit. A heat sink 20 is provided in an external surface of the cover casing 4 as an external heat discharging unit.

The heat sink 20 is shaped as a flat plate and includes an external base 22 provided on an external surface of the cover casing 4, and a plurality of external heat discharging fins 21 provided on top of the external base 22. The heat sink 20 may be manufactured integrally with the cover casing 4, or the heat sink 20 may be manufactured separately from the cover casing 4 and then mounted on the external surface of the cover casing 4.

The cover casing 4 may have a penetrating hole 5 (or a plurality of penetrating holes 5) formed thereon, and first and second passing holes 6 and 7 through which the cover casing 4 is coupled with the heat discharging unit 30. The cover casing 4 and the heat discharging unit 30 are engaged with each other by first and second screws 8 and 9 inserted into the first and the second passing holes 6 and 7, respectively.

A main board 10 and a plurality of hardware units and/or other components including, for example, a hard disk drive (not shown) may be installed in an inner space of the main casing 3.

Figure 2:
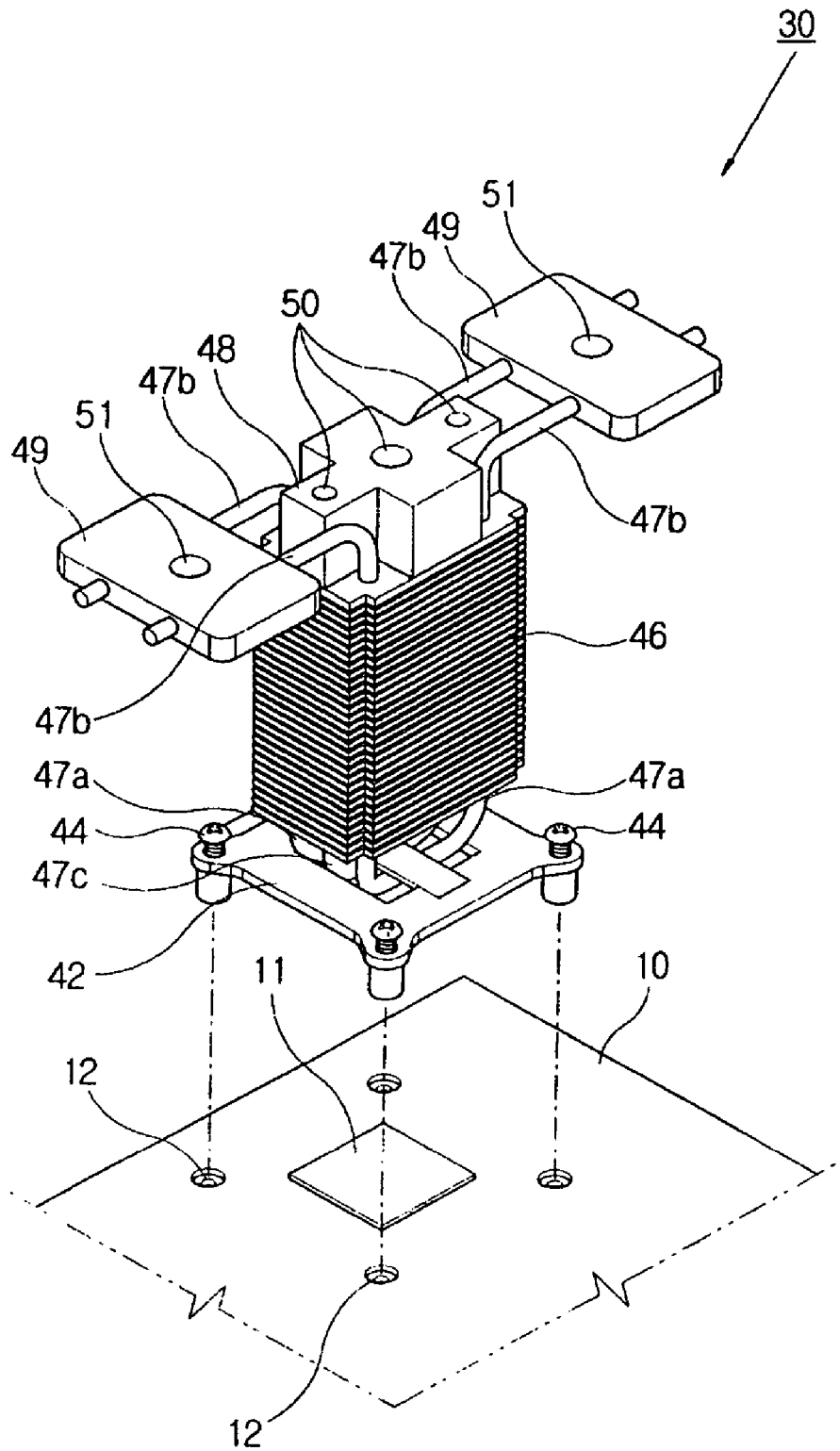
FIG. 2 is an enlarged view illustrating an installation region of a heat discharging unit of the computer of FIG. 1.

FIG. 2 is an enlarged view illustrating an installation region of the heat discharging unit 30 of the computer of FIG. 1. As illustrated in FIG. 2, a variety of components such as a central processing unit 11 (CPU) and a RAM (not shown) are mounted on the main board 10, and the CPU 11 is mounted on a socket (e.g., an LGA775 socket) provided on top of the main board 10.

The heat discharging unit 30 is installed on the main board 10 to discharge heat from one or more heat generating components, and the heat discharging unit 30 is coupled with the main board 10 by one or more third screws 44 (or fasteners). The heat generating components may include the CPU 11 and/or other components in the computer.

Figure 3:
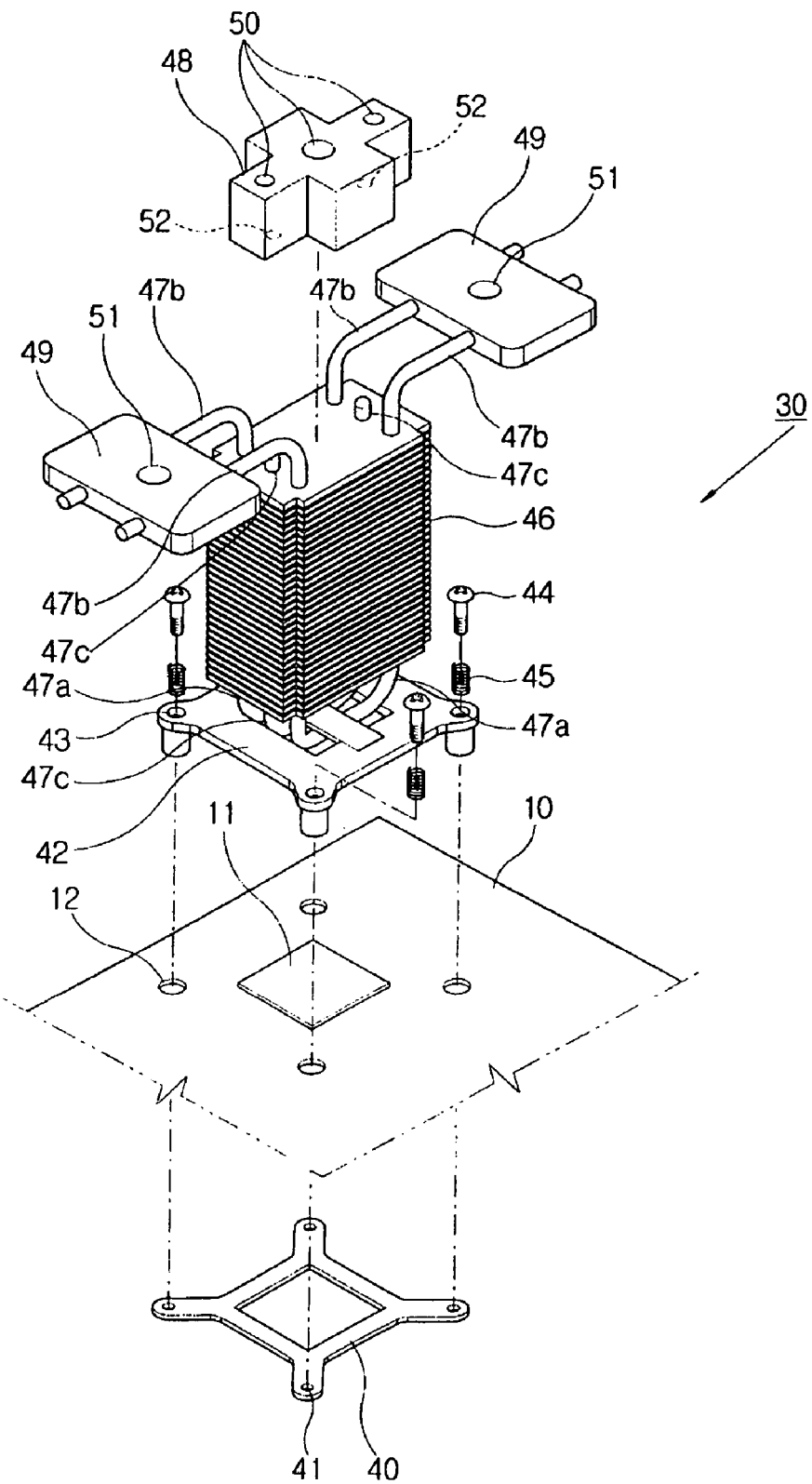
FIG. 3 is an exploded perspective view of the heat discharging unit and a main board of the computer of FIG. 1.

FIG. 3 is an exploded perspective view of the heat discharging unit 30 and the main board 10 of FIG. 2. Referring to FIGS. 2 and 3, the heat discharging unit 30 includes a support plate 40 (see FIG. 3) closely contacting a back of the main board 10, internal heat discharging units 42 and 46 coupled with a top of the main board 10, and a heat transmission unit to transmit the heat generated by the CPU 11 to the internal heat discharging units 42 and 46 and the heat sink 20, respectively, to allow the heat generated from the CPU 11 to be discharged from the internal heat discharging units 42 and 46 and the heat sink 20. The internal heat discharging units include an internal base 42 coupled to the support plate 40, between which the main board 10 is positioned, and a plurality of internal heat discharging fins 46 provided on top of the internal base 42. The heat transmission unit includes a pair of heat transmission plates 49 disposed on both sides of the plurality of internal heat discharging fins 46 so as to contact an internal surface of the cover casing 4 (see FIGS. 1, 4, and 5), an auxiliary heat transmission plate 48 disposed on top of the internal heat discharging fins 46, a pair of first heat pipes 47a and 47b to transmit the heat generated in the CPU 11 to the plurality of internal heat discharging fins 46 and the pair of heat transmission plates 49, and a second heat pipe 47c to transmit the heat generated in the CPU 11 to the plurality of internal heat discharging fins 46 and the auxiliary heat transmission plate 48.

The support plate 40 is disposed on the back of the main board 10 to support the internal heat discharging units 42 and 46 such that the internal heat discharging units 42 and 46 are firmly mounted on the top of the main board 10. The support plate 40 may be formed using various materials. For example, the support plate 40 may be made of a rigid material such as steel to prevent bending of the main board 10 from occurring due to weights of the internal heat discharging units 42 and 46.

The internal base 42 contacts the CPU 11 on the top of the main board 10 such that the heat generated from the CPU 11 is transmitted to the internal base 42.

The internal base 42 is engaged with the support plate 40 by the third screw(s) 44, between which the main board 10 is positioned. The third screw(s) 44 are engaged with one or more coupling holes 41 of the support plate 40 through one or more third passing holes 43 formed on the internal base 42 and one or more fourth passing holes 12 that penetrate the main board 10.

A spring member 45 is coupled with the third screw(s) 44. The spring member 45 functions to prevent the internal base 42 from applying an excessive force on the CPU 11 when the internal base 42 is engaged with the third screw(s) 44.

The plurality of internal heat discharging fins 46 are disposed on the top of the internal base 42 and may have regular intervals between them. Since air can smoothly flow through the intervals between the plurality of heat discharging fins 46, the heat transmitted to the internal heat discharging fines 46 is promptly discharged.

The first heat pipes 47a and 47b each include a main body 47a having a U-shape to extend through the plurality of internal heat discharging fins 46 so as to contact the internal base 42, and a bent part 47b extending from the main body 47a in a direction that is transverse with respect to the main body 47a passing through the plurality of internal heat discharging fins 46. The bent part(s) 47b are coupled to the heat transmission plate(s) 49. When the heat generated in the CPU 11 is transmitted to the first heat pipes 47a and 47b through the internal base 42, the heat is promptly transmitted to the internal heat discharging fins 46 and the pair of heat transmission plates 49 along the first heat pipes 47a and 47b. Although the embodiments of the present general inventive concept are described and illustrated as having a pair of transmission plates (i.e., 49), it should be understood that the heat discharging unit 30 may alternatively have one or more heat transmission plates.

The second heat pipe 47c also has a U-shape, one side of which contacts the internal base 42 and another side of which contacts the auxiliary heat transmission plate 48 by way of the plurality of heat discharging fins 46. According to this arrangement, when the heat generated in the CPU 11 is transmitted to the second heat pipe 47c through the internal base 42, the heat is promptly transmitted to the internal heat discharging fin 46 and the auxiliary heat transmission plate 48 along the second heat pipe 47c.

The auxiliary heat transmission plate 48 a cross-like shape, is to be coupled with a top side of the internal heat discharging fin 46, and is formed of a material such as aluminum having a good heat conductivity.

A receiving part 52 is provided in a lower region of the auxiliary heat transmission plate 48 to receive and accommodate one or more terminal regions of the second heat pipe 47c. One or more first coupling holes 50 are formed on the auxiliary heat transmission plate 48 to couple the auxiliary heat transmission plate 48 with the cover casing 4.

The terminal region of the second heat pipe 47c accommodated in the receiving part 52 of the auxiliary heat transmission plate 48 may be fixed, for example, by a welding operation. The auxiliary heat transmission plate 48 is coupled with the cover casing 4 by the first screw(s) 8 (see FIGS. 1, 4, and 5) engaged with the first coupling hole(s) 50 of the auxiliary heat transmission plate 48 through the first passing hole(s) 6 of the cover casing 4 (see FIG. 1). Referring to FIGS. 1 to 3, as the auxiliary heat transmission plate 48 closely contacts an internal surface of the cover casing 4, heat is promptly transmitted to the heat sink 20 of the cover casing 4 through the auxiliary heat transmission plate 48.

Each heat transmission plate 49 is shaped as a flat plate, coupled with terminal regions of the first heat pipes 47a and 47b (i.e., the bent part 47b). The transmission plates 49 may be formed of a material having a good heat conductivity such as aluminum.

One or more second coupling holes 51 are formed on the heat transmission plate 49 to couple the heat transmission plate 49 with the cover casing 4 using the second screw(s) 9 (or other fastener) to engage the second coupling hole(s) 51 of the heat transmission plate 49 through the second passing hole(s) 7 of the cover casing 4. According to this arrangement, since the heat transmission plate 49 closely contacts the internal surface of the cover casing 4 to correspond to the heat sink 20 provided on the external surface of the cover casing 4, the heat is promptly transmitted to the heat sink 20 of the cover casing 4 through the heat transmission plate 49.

Figure 4:
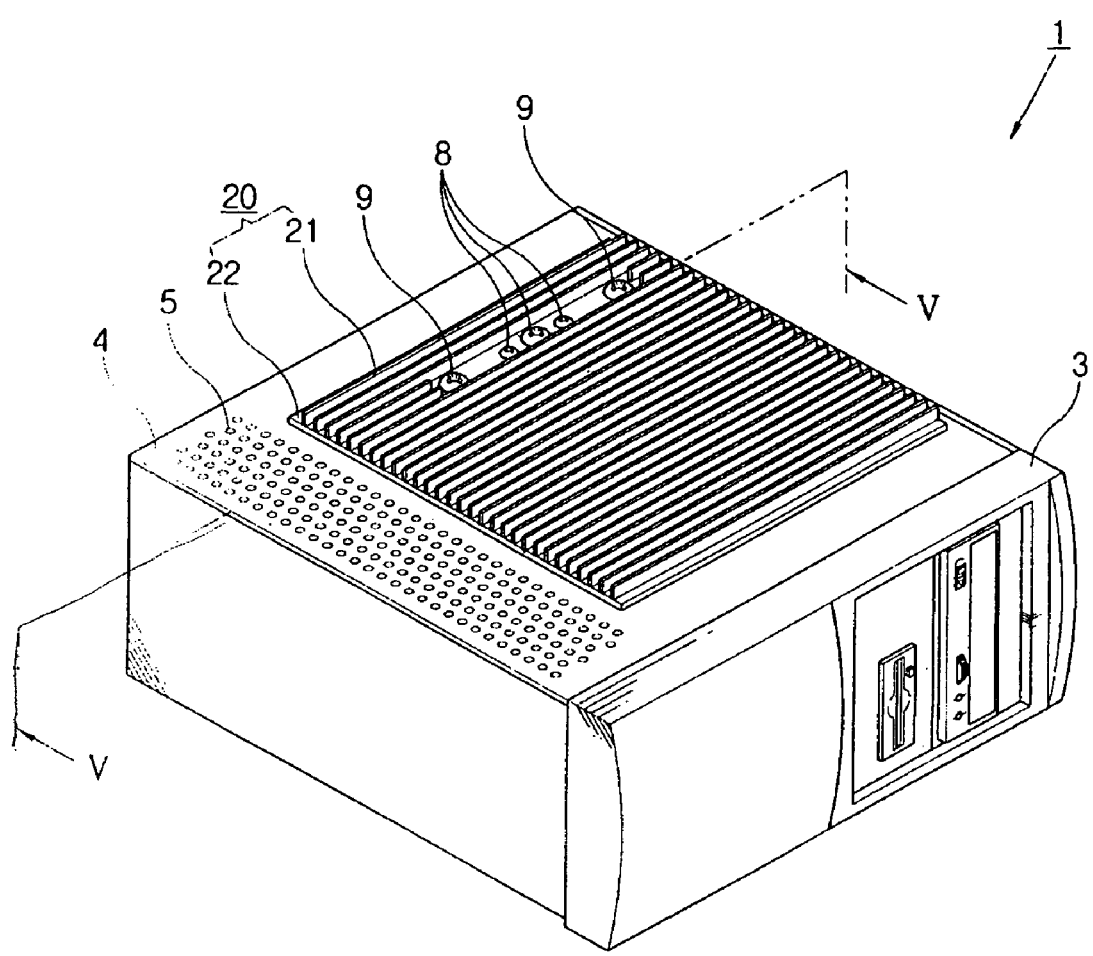
FIG. 4 is a perspective view of the computer of FIG. 1 in a state in which the main casing and the cover casing are closed, according to an embodiment of the present general inventive concept.
Figure 5:
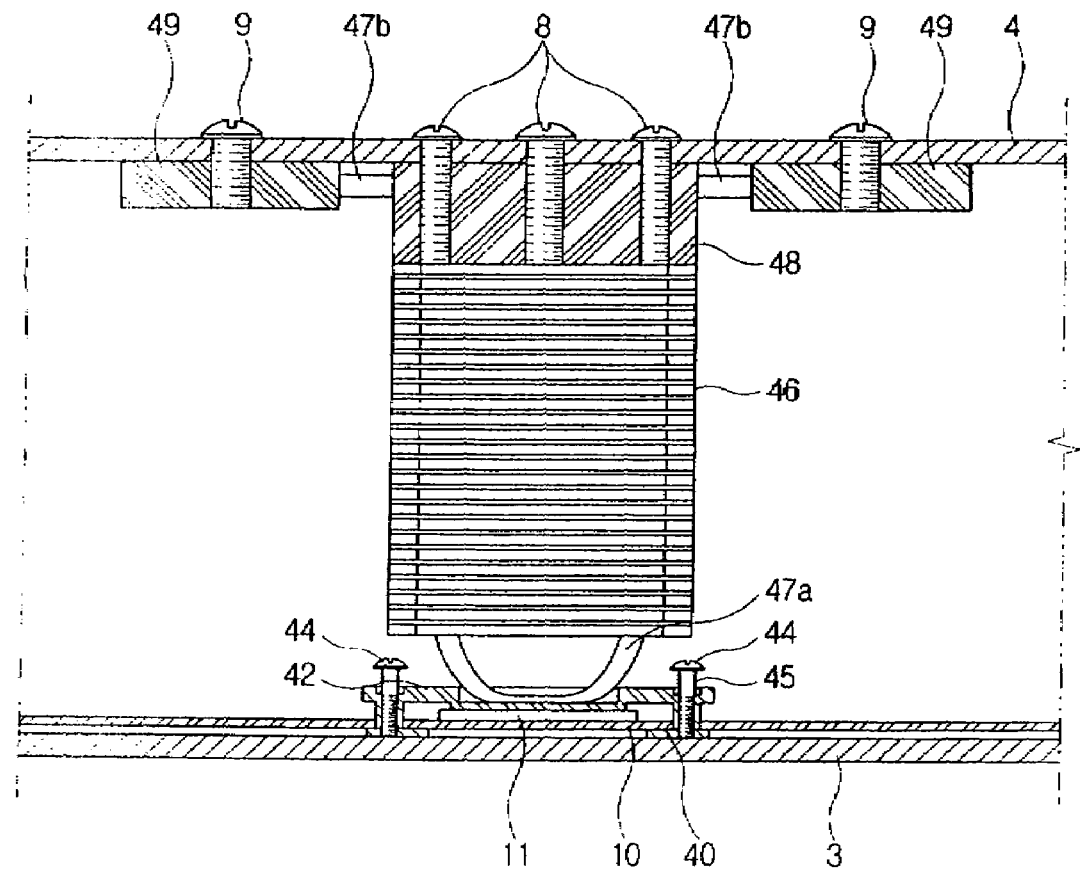
FIG. 5 is a sectional view of the computer of FIG. 4 taken along line of V-V.

Hereinbelow, a method of mounting the heat discharging unit 30 on the main board 10 will be described. FIG. 4 is a perspective view of the computer of FIG. 1 in a state in which the main casing 3 and the cover casing 4 are closed. FIG. 5 is a sectional view of the computer of FIG. 4 taken along line of V-V.

The first and second heat pipes 47a, 47b, and 47c, and the internal heat discharging fins 46 are coupled to the internal base 42. The first heat pipes 47a and 47b are coupled with the heat transmission plate(s) 49, the second heat pipe 47c is coupled with the auxiliary heat transmission plate 48, the support plate 40 of the heat discharging unit 30 closely contacts the back of the main board 10, and the internal base 42 is coupled with the main board 10 using the third screw(s) 44. That is, when the third screw(s) 44 engage the coupling hole (s) 41 of the support plate 40 through the third passing hole(s) 42 formed on the internal base 42 and the fourth passing hole(s) 12 extending through the main board 10, the internal base 42 is coupled with the support plate 40 by the third screw(s)44, between which the main board 10 is positioned.

Next, the cover casing 4 and the main casing 3 are coupled and engaged by the first and the second screws 8 and 9 as illustrated in FIG. 4, thereby completing the assembly of the computer in a simple manner. As illustrated in FIG. 5, the internal base 42 is disposed on the CPU 11, the internal heat discharging fins 46 are disposed on top of the internal base 42, and the auxiliary heat transmission plate 48 and the heat transmission plate(s) 49 closely contact the internal surface of the cover casing 4.

According to this arrangement, when the heat generated in the CPU 11 is transmitted to the first and the second heat pipes 47a, 47b and 47c through the internal base 42, the heat is efficiently transmitted to the internal heat discharging fins 46 and the pair of heat transmission plates 49 along the first heat pipes 47a and 47b, and is efficiently transmitted to the internal heat discharging fins 46 and the auxiliary heat transmission plate 48 along the second heat pipe 47c.

Since the heat transmission plate 49 and the auxiliary heat transmission plate 48 closely contact the internal surface of the cover casing 4, the heat transmitted to the heat transmission plate 49 and the auxiliary heat transmission plate 48 is transmitted through the cover casing 4 to the heat sink 20 provided on the external surface of the cover casing 4.

Accordingly, the heat generated by the CPU 11 is discharged from the internal heat discharging fins 46 inside the computer casing 1 and the heat sink 20 outside the casing 1 respectively, thereby improving an efficiency with which the heat is discharged. In particular, the efficiency of discharging the heat is improved since the heat generated by the CPU 11 is transmitted to the cover casing 4, which is exposed to external air and has a wide area, and is discharged through the heat sink 20 provided outside the cover casing 4. According to the embodiments of the present general inventive concept, the heat discharging efficiency can be greatly improved without providing a large-sized heat discharging fin and cooling fan.

Although the embodiments of the present general inventive concept are described with reference to screws, it should be understood that other types of fasteners may alternatively be used that achieve the purposes of the present general inventive concept as set forth herein.

Also, although the computer of FIG. 1 includes the cooling fan 13, it should be understood that the heat discharging unit 30 of the embodiments of the present general inventive concept may make the cooling fan 13 unnecessary. Thus, the computer may not include the cooling fan 13. However, when the cooling fan 13 is included in the computer, the heat that is discharged from the internal heat discharging fins 46 may be efficiently removed from the computer casing 1 during operation of the computer by the cooling fan 13.

In the embodiments of the present general inventive concept, internal and external heat discharging parts discharge heat from a heat generating component, for example, a CPU. Although the heat generating component is described as the CPU, it should be understood that the internal and external heat discharging parts may be provided so as to cool a variety of heat generating components including, for example, a graphic card or a chipset that generates a large amount of heat, in addition to or instead of the CPU.

Although the embodiments of the present general inventive concept have been described to have an external heat discharging part provided in a cover casing, which is detachably coupled with an opening of a main casing, it should be understood that a variety of other arrangements between the external heat discharging part and an external surface of the cover casing may be used. Additionally, the external heat discharging part may have other shapes.

As described above, according to the embodiments of the present general inventive concept, a computer has a simple structure and assembly and an improved heat discharging efficiency.

Although a few embodiments of the present general inventive concept have been shown and described, it will be appreciated by those skilled in the art that changes may be made in these embodiments without departing from the principles and spirit of the invention, the scope of which is defined in the appended claims and their equivalents.

What is claimed is:

1. A computer, comprising:
 a main board having a heat generating component that generates heat disposed thereon;
 a casing to accommodate the main board therein;
 an internal heat discharging part disposed in the casing and coupled with the main board to discharge a first portion of the heat generated by the heat generating component;
 an external heat discharging part provided on and overlaying an external surface of the casing to discharge a second portion of the heat from the casing; and
 a heat transmission part to transmit the first and second portions of the heat generated in the heat generating component to the internal and the external heat discharging parts, respectively, such that the first and second portions of the heat generated by the heat generating component is discharged through the internal and the external heat discharging parts, respectively,
 wherein the internal heat discharging part comprises:
 a base part coupled with the main board to contact the heat generating component; and
 a plurality of heat discharging fins provided on top of the base part.

2. The computer according to claim 1, wherein the heat transmission part comprises a heat transmission pipe having a first side that contacts the heat generating component and a second side that contacts the external heat discharging part by way of the internal heat discharging part.

3. The computer according to claim 2, wherein the heat transmission part further comprises a heat transmission plate coupled with the second side of the heat transmission pipe to contact an internal surface of the casing to transmit the second portion of the heat to the external heat discharging part.

4. The computer according to claim 3, wherein the heat transmission pipe comprises:
 a main body extending through the heat discharging fins to contact the base part; and
 a bent part bent with respect to the main body along a direction that is transverse with respect to the main body and is coupled with the heat transmission plate.

5. The computer according to claim 4, wherein the heat transmission part further comprises an auxiliary heat transmission plate interposed between the internal heat discharging part and an internal surface of the casing to transmit the second portion of the heat to the external heat discharging part.

6. The computer according to claim 5, further comprising:
 one or more coupling parts to couple the heat transmission pipe and the auxiliary heat transmission plate respectively to the casing.

7. The computer according to claim 3, wherein the heat transmission part further comprises an auxiliary heat transmission plate interposed between the internal heat discharging part and the internal surface of the casing to transmit the second portion of the heat to the external heat discharging part.

8. The computer according to claim 7, further comprising:
 one or more coupling parts to couple the heat transmission pipe and the auxiliary heat transmission plate respectively to the casing.

9. The computer according to claim 3, wherein the heat transmission part further comprises an auxiliary heat transmission plate interposed between the internal heat discharging part and the internal surface of the casing to transmit the second portion of the heat to the external heat discharging part.

10. The computer according to claim 9, further comprising:
 one or more coupling parts to couple the heat transmission pipe and the auxiliary heat transmission plate respectively to the casing.

11. The computer according to claim 2, wherein the heat transmission part further comprises an auxiliary heat transmission plate interposed between the internal heat discharging part and an internal surface of the casing to transmit the second portion of the heat to the external heat discharging part.

12. The computer according to claim 11, further comprising:
 one or more coupling parts to couple the heat transmission pipe and the auxiliary heat transmission plate respectively to the casing.

13. The computer according to claim 1, wherein the heat transmission part comprises an auxiliary heat transmission plate interposed between the internal heat discharging part and an internal surface of the casing to transmit the second portion of the heat to the external heat discharging part.

14. The computer according to claim 13, further comprising:
 one or more coupling parts to couple the heat transmission pipe and the auxiliary heat transmission plate respectively to the casing.

15. The computer according to claim 1, wherein the external heat discharging part comprises a heat sink coupled with the external surface of the casing.

16. A computer, comprising:
 a casing including a heat sink disposed on and overlaying an external surface thereof;
 a heat generating component disposed in the casing that generates heat during operation; and a heat discharging fin unit disposed on the heat generating component and being connected to the heat sink of the casing via one or more heat transmission plates, wherein the heat conducting parts comprise U-shaped pipes having a bottom portion in contact with the heat generating component and top portions connected to the one or more transmission plates.

17. The computer according to claim 16, wherein the heat sink is disposed on a lateral side of the casing, and the computer further comprises:

a cooling fan disposed adjacent to the heat discharging fin unit at a rear side of the casing to move heat discharged thereby out of the casing.

18. The computer according to claim 16, wherein the one or more heat transmission plates are connected to the heat generating component by the one or more heat conducting parts extending through the heat discharging fin unit.

19. The computer according to claim 16, wherein the one or more transmission plates comprise a transmission plate disposed between the heat discharging fin unit and the heat sink of the casing.

20. The computer according to claim 16, further comprising:

one or more heat conducting parts extending through the heat discharging fin unit to connect the heat generating component with the one or more heat transmission plates; and an internal base installed above the heat generating component on which the heat discharging fin unit is arranged and having an opening portion through which the heat conducting parts extend to contact the heat generating component.

21. The computer according to claim 16, wherein the heat discharging fin unit discharges heat internally while the heat sink of the casing discharges heat externally.

22. The computer according to claim 16, wherein the heat discharging fin unit comprises a stack of fins spaced apart at predetermined intervals, and each fin extending along a plane that is parallel to the heat generating component.

* * * * *